US012671401B2

(12) United States Patent
Dorsey et al.

(10) Patent No.: US 12,671,401 B2
(45) Date of Patent: Jun. 30, 2026

(54) NOISE MITIGATION IN ELECTRONIC DEVICES INCLUDING NEURAL NETWORK CIRCUITS

(71) Applicant: Apple Inc., Cupertino, CA (US)

(72) Inventors: John G Dorsey, San Francisco, CA (US); Bryan R Hinch, Campbell, CA (US); Jason P Jane, Morgan Hill, CA (US); Karthic A Palaniappan, Cupertino, CA (US); Mark I Mansi, Cupertino, CA (US); Ronit Banerjee, Mountain View, CA (US); Timothy J Detwiler, Seattle, WA (US)

(73) Assignee: Apple Inc., Cupertino, CA (US)

( * ) Notice: Subject to any disclaimer, the term of this patent is extended or adjusted under 35 U.S.C. 154(b) by 102 days.

(21) Appl. No.: 18/900,143

(22) Filed: Sep. 27, 2024

(65) Prior Publication Data

US 2026/0095165 A1 Apr. 2, 2026

(51) Int. Cl.
*H03K 5/1252* (2006.01)

(52) U.S. Cl.
CPC .................................. *H03K 5/1252* (2013.01)

(58) Field of Classification Search
CPC ..................................................... H03K 5/1252
USPC ......................................................... 327/552
See application file for complete search history.

(56) References Cited

U.S. PATENT DOCUMENTS 11,294,747 B2 * 4/2022 Kegel ................... G06F 11/076
11,379,708 B2 7/2022 Idgunji et al.

2020/0012924 A1 1/2020 Ma et al.
2020/0097807 A1 3/2020 Knag et al.
2022/0100254 A1 3/2022 Szurtei
(Continued)

FOREIGN PATENT DOCUMENTS

CN 114119415 A 3/2022
CN 114333874 A 4/2022
(Continued)

OTHER PUBLICATIONS

K. Kiyoyama et al., "Development of a CDS Circuit for 3-D Stacked Neural Network Chip using CMOS Analog Signal ," Source: IEEE 2019 International 3D Systems Integration Conference, 3DIC 2019 Article 9058856 (IEEE 2019 International 3D Systems Integration Conference, 3DIC 2019), https://doi.org/10.1109/3DIC48104.2019. 9058856.

*Primary Examiner* — Tomi Skibinski
(74) *Attorney, Agent, or Firm* — FLETCHER YODER PC

(57) ABSTRACT

This disclosure is directed to noise mitigation for processing circuitry of an electronic device having a neural network circuit. A neural network circuit may include multiple neural network layers (e.g., a transformer) to perform inference operations. The processing circuitry may include a noise mitigation circuit to reduce a magnitude or magnitude response of noise signals, for example, at one or more frequencies. The noise mitigation circuit may reduce an amplitude of the noise signals by aperiodically providing different clock signals having different clock frequencies to the neural network layers during an inference operation. Alternatively or additionally, the noise mitigation circuit may reduce an amplitude of the noise signals by aperiodically changing clock signal frequencies and supply voltage values of the neural network layers during the inference operation.

20 Claims, 3 Drawing Sheets

(56)               References Cited

U.S. PATENT DOCUMENTS

| | | |
|---|---|---|
| 2023/0409892 A1 | 12/2023 | Lee et al. |
| 2024/0054024 A1 | 2/2024 | Kwon et al. |
| 2025/0356190 A1* | 11/2025 | Cho ........................ G06N 3/084 |

FOREIGN PATENT DOCUMENTS

| | | | |
|---|---|---|---|
| CN | 114626500 A | 6/2022 | |
| CN | 117973292 A | 5/2024 | |

* cited by examiner

NOISE MITIGATION IN ELECTRONIC DEVICES INCLUDING NEURAL NETWORK CIRCUITS

BACKGROUND

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

The present disclosure is generally directed to noise mitigation for processing circuitry of an electronic device having a neural network circuit. A neural network circuit may perform inference operations using one or more neural network layers (e.g., a transformer). If not compensated for, in some cases, the neural network layers may output undesired noise signals during an inference operation. Moreover, in specific cases, the noise signals may cause a negative user experience or interfere with one or more signals and/or device operations of the processing circuitry and/or the electronic device.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, processing circuitry is described. The processing circuitry may include a neural network circuit that may implement a transformer comprising a first layer and a second layer. The first layer may operate based on a first clock signal and the second layer may operate based on a second clock signal. The processing circuitry may include a noise mitigation circuit coupled to the neural network circuit. The noise mitigation circuit may output the first clock signal having a first frequency during a first time duration, and output the second clock signal having a second frequency during a subsequent time duration based on a noise mitigation condition.

In another embodiment, an electronic device is described. The electronic device may include a neural network circuit that may implement multiple layers. The electronic device may include a noise mitigation circuit coupled to the neural network circuit, where the noise mitigation circuit may aperiodically output different clock signals to the neural network circuit based on a noise mitigation condition of the electronic device.

In yet another embodiment, tangible, non-transitory, computer-readable media storing instructions that, when executed by processing circuitry, cause the processing circuitry to perform operations is described. The operations may include receiving a first indication to perform transformation operations by multiple neural network layers, changing a first clock signal frequency of a first neural network layer of the multiple neural network layers to a first frequency during a first transformation operation of the first neural network layer, and changing a second clock signal frequency of a second neural network layer of the multiple neural network layers to a second frequency during a second transformation operation of the second neural network layer based on a noise mitigation condition.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION

Figure 1:
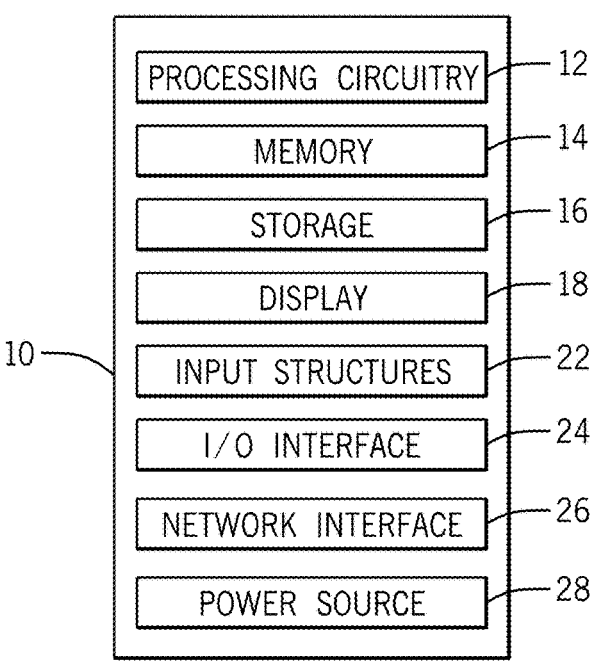
FIG. 1 is a block diagram of an electronic device, according to embodiments of the present disclosure.

When introducing elements of various embodiments of the present disclosure, the articles "a," "an," and "the" are intended to mean that there are one or more of the elements. The terms "including" and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member or a set may include multiple members. Furthermore, the term "continuous" may correspond to an activity that occurs without interruption or a consecutive repetition with a relatively short time period therebetween.

This disclosure is directed to noise mitigation for processing circuitry of an electronic device having a neural network circuit. A neural network circuit may include multiple neural network layers (e.g., a transformer) to perform inference operations. If not compensated for, in some cases, the neural network layers may output undesired noise signals during an inference operation. Moreover, the noise signals may cause a negative user experience or interfere with one or more signals and/or device operations of the processing circuitry and/or the electronic device. In specific cases, the noise signals may be within an audible frequency range and cause interference with device operations such as audio and/or video recording, phone calls, and/or audio and video playbacks, among other possibilities. The processing circuitry may include a noise mitigation circuit to reduce a magnitude or magnitude response of noise signals, for example, at the audible frequency range.

In some embodiments, the noise mitigation circuit may provide multiple clock signals with aperiodically changing clock frequencies to multiple neural network layers during an inference operation. In alternative or additional embodiments, the noise mitigation circuit may provide each of the multiple clock signals with a respective supply voltage having aperiodically changing voltage values to the multiple neural network layers during the inference operation. As such, the noise mitigation circuit may reduce the magnitude of the noise signals.

FIG. 1 is a block diagram of an electronic device 10 including processing circuitry 12, according to embodiments of the present disclosure. The electronic device 10 may include, among other things, the processing circuitry 12, memory 14, nonvolatile storage 16, a display 18, input structures 22, an input/output (I/O) interface 24, a network interface 26, and a power source 28. The various functional blocks shown in FIG. 1 may include hardware elements (including circuitry), software elements (including machine-executable instructions) or a combination of both hardware and software elements (which may be referred to as logic). The processing circuitry 12, memory 14, the nonvolatile storage 16, the display 18, the input structures 22, the I/O interface 24, the network interface 26, and/or the power source 28 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer, a portable electronic or handheld electronic device such as a wireless electronic device or smartphone, a tablet, a wearable electronic device, and other similar devices. In additional or alternative embodiments, the electronic device 10 may include an access point, such as a base station, a router (e.g., a wireless or Wi-Fi router), a hub, a switch, and so on. It should be noted that the processing circuitry 12 and other related items in FIG. 1 may be embodied wholly or in part as software, hardware, or both. Furthermore, the processing circuitry 12 and other related items in FIG. 1 may be a single contained processing module or may be incorporated wholly or partially within any of the other elements within the electronic device 10.

The processing circuitry 12 may include one or more processor cores such as application processors, baseband processors, or both, among other possibilities, and perform various device operations described herein. Moreover, the processing circuitry 12 may include any combination of general-purpose microprocessors, microcontrollers, digital signal processors (DSPs), field programmable gate array (FPGAs), programmable logic devices (PLDs), controllers, state machines, one or more hardened logic circuits (e.g., gated logic circuits), discrete hardware components, dedicated hardware finite state machines, or any other suitable entities that may perform calculations or other manipulations of information. For example, the processing circuitry 12 may include neural network circuits implemented on one or multiple of such components.

The memory 14, the nonvolatile storage 16, or both may be a single contained memory/storage module or may be incorporated wholly or partially within any of the other elements within the electronic device 10. In some embodiments, the processing circuitry 12 may be operably coupled to the memory 14 and the nonvolatile storage 16 to perform various device operations (e.g., algorithms) such as inference operations. In some cases, a neural network circuit may perform inference operation for generating output data based on receiving input data. The neural network circuit may include one or more processor cores, programmable or hardened logic circuits, or both. The processing circuitry 12 may retrieve at least a portion of raw data for performing the device operations from the memory 14 and/or the nonvolatile storage 16, among other possibilities.

Alternatively or additionally, a user may provide inputs associated with the raw data or cause retrieving inputs associated with the raw data. For example, the user may provide the inputs via the display 18, the input structures 22, the I/O interface 24, the network interface 26, or a combination thereof, among other possibilities. Moreover, the processing circuitry 12 may generate and provide the output data to a processor, the memory 14, the nonvolatile storage 16, the display 18, the input structures 22, the I/O interface 24, the network interface 26, or a combination thereof, among other possibilities. Programs, instructions, or routines executed by the processing circuitry 12 for performing the device operations may be stored in any suitable article of manufacture that includes one or more tangible, computer-readable media.

The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processing circuitry 12 to enable the electronic device 10 to perform various device operations.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, a universal serial bus (USB), or other similar connector and protocol.

The network interface 26 may include, for example, one or more wired and/or wireless interfaces. In some embodiments, the network interface 26 may include one or more transceivers for data communication using any version of a serializer and deserializer (SerDes) interface, a peripheral component interconnect express (PCIe) interface, or any other viable interfacing protocol, such as various communication standards. It should be appreciated that the network interface 26 may include and/or utilize any viable circuitry to facilitate data communication between multiple circuits, components, chips, integrated circuits (ICs), and so on. For example, the network interface 26 may be coupled to a first chip and a second chip to provide a chip-to-chip (C2C) interface.

In alternative or additional embodiments, the network interface 26 may include one or more transceivers and/or antennas for a personal area network (PAN), such as an ultra-wideband (UWB) or a BLUETOOTH network, a local area network (LAN) or wireless local area network (WLAN), such as a network employing one of the IEEE 802.11x family of protocols (e.g., WI-FI), and/or a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, Long Term Evolution (LTE) cellular network, Long Term Evolution License Assisted Access (LTE-LAA) cellular network, $5^{th}$ generation (5G) cellular network, and/or New Radio (NR) cellular network, a $6^{th}$ generation (6G) or greater than 6G cellular network, a satellite network, a non-terrestrial network, and so on, among other possibilities. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX), mobile broadband Wireless networks (mobile WIMAX), asynchronous digital subscriber lines (e.g., ADSL, VDSL), digital video broadcasting-terrestrial (DVB-T) network and its extension DVB Handheld (DVB-H) network, ultra-wideband (UWB) network, alternating current (AC) power lines, and so forth. The power source 28 of the electronic device 10 may include any suitable source of power, such as a rechargeable lithium polymer (Li-poly) battery and/or an alternating current (AC) power converter.

Figure 2:
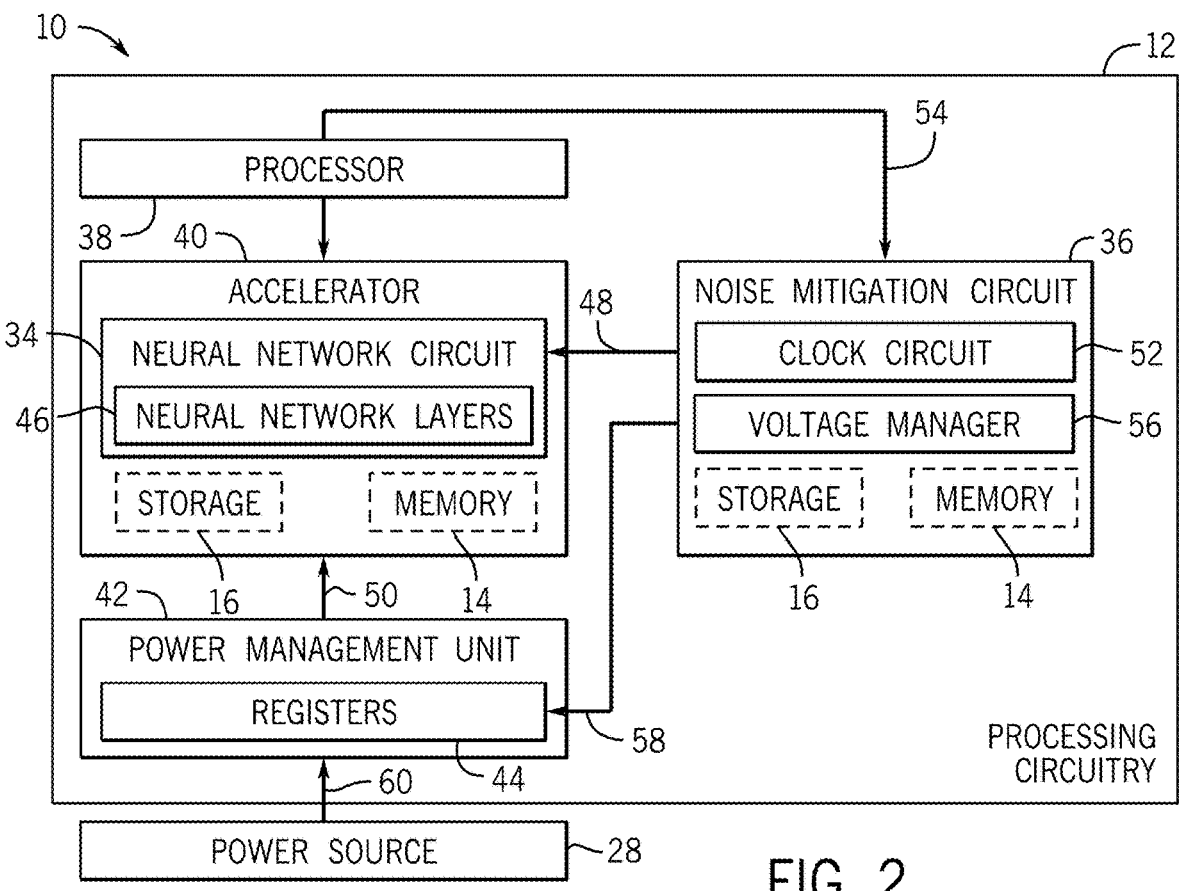
FIG. 2 a functional block diagram of the processing circuitry of the electronic device of FIG. 1 including a neural network circuit and a noise mitigation circuit, according to embodiments of the present disclosure.

FIG. 2 is a block diagram of the processing circuitry 12 of the electronic device 10 discussed above including a neural network circuit 34 and a noise mitigation circuit 36, according to embodiments of the present disclosure. As used herein, the term "circuit" may include hardware, though it is contemplated that in additional or alternative embodiments, it may include software, logic, and/or firmware, alone or in combination with hardware. The processing circuitry 12 may include a processor 38, an accelerator 40, a power management unit 42, one or more registers 44, and at least a portion of the memory 14 and/or the nonvolatile storage 16.

The neural network circuit 34 may perform inference operation for generating the output data based on receiving the input data. In some cases, the processor 38 and/or the noise mitigation circuit 36 may reduce and/or disperse a magnitude or magnitude response of noise signals associated with the neural network circuit 34, as will be appreciated. In some cases, the accelerator 40 may improve operation efficiency or increase operational capacity of the processor 38 by performing one or more supplementary processing operations. For example, the processor 38 may provide at least a portion of the input data to the accelerator 40. Alternatively or additionally, the accelerator 40 may generate at least a portion of the output data. In the depicted embodiment, the accelerator 40 may implement (e.g., include) the neural network circuit 34. It should be appreciated that in alternative or additional embodiments, the processor 38 or any other viable circuit may include (e.g., implement) at least a portion of the neural network circuit 34.

The power management unit 42 may be coupled to the power source 28. The power management unit 42 may receive a supply voltage from the power source 28, convert the supply voltage to one or multiple desired supply voltage values of the processor 38, noise mitigation circuit 36, and/or the accelerator 40. Moreover, the power management unit 42 may provide the supply voltages to the processor 38, noise mitigation circuit 36, and/or the accelerator 40. The power management unit 42 may include voltage up-converters, down-converters, buck-converters, or a combination thereof, among other things. The power management unit 42 may include the registers 44 storing indications (e.g., logic values) indicative of voltage values of the accelerator 40.

As mentioned above, the memory 14, the nonvolatile storage 16, or both may be a single contained memory/storage module or may be incorporated wholly or partially within any of the other elements. In the depicted embodiment, the processing circuitry 12 may include at least a portion of the memory 14 and/or the nonvolatile storage 16. It should be appreciated that in some embodiments, one or more of the noise mitigation circuit 36, the processor 38, the accelerator 40, the power management unit 42, the registers 44, and the memory 14 and/or the nonvolatile storage 16 may form a central processing unit (CPU) and/or a graphics processing unit (GPU).

Moreover, it should be appreciated that the processor 38, the accelerator 40, the neural network circuit 34, the noise mitigation circuit 36, and/or the power management unit 42 may each include at least a portion of one or more processing components of the processing circuitry 12. The processing components may include one or more processor cores, one or more microprocessors, one or more microcontrollers, one or more DSPs, one or more FPGAs, one or more PLDs, one or more controllers, one or more state machines, one or more hardened logic circuits (e.g., gated logic circuits), one or more discrete hardware components, one or more dedicated hardware finite state machines, or any combination thereof, among other things.

For example, the processor 38 may include at least one processor core, among other things. Moreover, the accelerator 40 and/or the noise mitigation circuit 36 may include one or more programmable and/or hardened logic circuits, processor cores, or both, among other things. In some embodiments, the processor 38 and/or the accelerator 40 may include at least a portion of the noise mitigation circuit 36, the power management unit 42, or both. It should be appreciated that in different embodiments, each of the processor 38, the accelerator 40, and the noise mitigation circuit 36 may include different combination of components and/or different components. In specific cases, a power management and regulation circuit (PMGR) of the processing circuitry 12 may include the noise mitigation circuit 36.

In some cases, the neural network circuit 34 (or the accelerator 40) may implement neural network layers 46 based on bitstream or data stored in the memory 14, the nonvolatile storage 16, or both. It should be appreciated that in alternative or additional embodiments, the processor 38 or any other circuit of the processing circuitry 12 may include (e.g., implement) at least a portion of the neural network layers 46. The neural network layers 46 may be sequenced in series such that a first neural network layer 46 may receive the input data and a last neural network layer 46 may provide the output data.

As discussed above, the processing circuitry 12 may enable an electronic device, such as the electronic device 10 of FIG. 1, to perform various device operations including the inference operations. In the depicted embodiment, the processing circuitry 12 may generate the output data by the neural network layers 46 based on the input data. The processing circuitry 12 may receive the input data or may generate the input data based on receiving the raw data. For example, the raw data may correspond to any viable type of raw data such as, but not limited to, a paragraph including multiple text sentences, a text sentence including multiple words, an image, an audio file, a video file, various sensor data, among other possibilities.

In some embodiments, the processor 38 may break down the raw data into data units that may be convertible to numerical vectors (e.g., input vectors). Moreover, the processor 38 may generate and/or provide the input data by converting the data units to sets of numerical vectors (e.g., sets of sequenced numerical vectors). In alternative or additional embodiments, the neural network circuit 34 and/or the accelerator 40 may break down the raw data into the data units and/or generate the input data by converting the data units to the sets of numerical vectors.

With the foregoing in mind, the neural network layers 46 may perform an inference operation for generating the output data based on the input data. As mentioned above, the neural network layers 46 may be sequenced in series. For example, each neural network layer 46 may perform a respective portion of an inference operation, hereinafter referred to as a transformation operation.

In some embodiments, each neural network layer 46 may generate result data based on receiving each set of numerical vectors or the respective result data. In some cases, each result data may include a set of result numerical vectors generated by a previous neural network layer 46 within the sequence of the neural network layers 46. In specific cases, each neural network layer 46 may transform each received set of numerical vectors or the respective result data with a set of weights and biases to generate subsequent result data.

For example, the first neural network layer 46 may generate first result data based on receiving the input data. The first neural network layer 46 may output the first result data to a second neural network layer 46 serially coupled thereto. The second neural network layer 46 may generate and output second result data based on receiving the first result data. Each subsequent (e.g., third, fourth, and so on) neural network layer 46 may generate and output respective result data to a subsequent neural network layer 46 serially coupled thereto. For example, the output data may include predictive or descriptive data associated with and/or within a context of the input data.

In some cases, a last neural network layer 46 may generate the output data. Alternatively or additionally, the processor 38, the accelerator 40, the neural network circuit 34, or a combination thereof, among other things, may further process result data of the last neural network layer 46 to provide the output data. For example, an electronic device, such as the electronic device 10 of FIG. 1, may perform one or more device operations based on the output data.

During an inference operation, a set of neural network layers 46 may perform transformation operations. For example, each of the neural network layers 46 may perform the respective transformation operations in a sequential order. Each neural network layer 46 may perform the transformation operations based on a clock frequency of a clock signal 48 and a voltage value of a supply voltage 50. The neural network layers 46 may receive a single clock signal 48 and/or a supply voltage 50 having a single voltage value during normal conditions of the processing circuitry 12 and/or the electronic device 10. In different cases, the single clock signal 48 may have a different frequency value and/or the single supply voltage 50 may have a different voltage value during the normal conditions. The normal conditions of the processing circuitry 12 and/or the electronic device 10 may correspond to noise mitigation conditions being absent, as will be appreciated. For example, the noise mitigation circuit 36 may output a single clock signal 48 to the neural network circuit 34 via a clock circuit 52 during the normal conditions. The clock circuit 52 may include one or more clock generating oscillators (e.g., crystal oscillators) and/or phase-locked loops (PLLs) to generate the clock signal 48.

If not compensated for, in some cases, one or more of the neural network layers 46 may output undesired noise signals. The noise signals may be outside of a frequency range of the neural network circuit 34 and/or within an undesired frequency range (e.g., audible frequency range). The processor 38 and the noise mitigation circuit 36 may reduce and/or disperse a magnitude of the noise signals during noise mitigation conditions by performing noise mitigation operations. The noise mitigation operations may include Adaptive Clock (ADCLK) PLL and Dynamic Voltage and Frequency Management (DVFM).

The processor 38 may determine whether a noise mitigation condition associated with the processing circuitry 12 and/or the electronic device 10 is present. In some embodiments, the processor 38 may determine whether a magnitude or magnitude response of noise signals at one or more frequencies (e.g., of a frequency range) is higher than a magnitude response threshold. In some cases, the processor 38 may determine that the raw data may correspond to an inference operation with a magnitude response higher than the magnitude response threshold. Alternatively or additionally, the processor 38 may determine whether the raw data corresponds to an inference operation and/or periodic transformation operations with a voltage draw higher than a voltage threshold. For example, the noise mitigation condition may be associated with one or more of the neural network layers 46 performing one or more transformation operations with an electrical current draw higher than a current threshold.

In some embodiments, the processor 38 may determine whether the raw data corresponds to an inference operation and/or periodic transformation operations with a power consumption (e.g., a periodic power consumption) higher than a power threshold. In some cases, the processor 38 may determine whether the electronic device 10 is performing a device operation associated with a noise mitigation condition. For example, such device operations may include wide-band audio recording (e.g., cinematic audio recording), among other possibilities.

Alternatively or additionally, the processor 38 may determine whether the neural network circuit 34 is disposed within (e.g., equal to or less than) a threshold distance of one or more noise sensitive components of the electronic device 10. If not compensated for, the noise signals may interfere with one or more signals and/or device operations of the noise sensitive components. The noise sensitive components may include the memory 14, the nonvolatile storage 16, the display 18, the input structures 22, the I/O interface 24, and/or the network interface 26 of the electronic device 10 shown in FIG. 1, among other possibilities. For example, the noise sensitive components may include one or more components with magnetic or electromagnetic circuitry (e.g., a microphone, a speaker, among other things) that may receive at least a portion of the noise signals and negatively impact user experience.

The processor 38 may output a noise mitigation indication 54 based on one or more of the above noise mitigation conditions and/or other noise mitigation conditions being present. For example, in different cases, the processor 38 may output the noise mitigation indication 54 based on different combination of the above noise mitigation conditions and/or other noise mitigation conditions. The processor 38 may output the noise mitigation indication 54 to the noise mitigation circuit 36.

The noise mitigation circuit 36 may perform a noise mitigation operation based on receiving the noise mitigation indication 54. In some cases, the noise mitigation circuit 36 may aperiodically change clock frequencies of the neural network circuit 34 (e.g., ADCLK PLL). In alternative or additional cases, the noise mitigation circuit 36 may aperiodically change the clock frequencies and voltage values of the neural network circuit 34 (e.g., DVFM). The processor 38 may remove the noise mitigation indication 54 in the absence of the noise mitigation conditions or termination of the noise mitigation conditions.

In some cases, during a noise mitigation condition, the noise mitigation circuit 36 may output multiple clock signals 48 having different clock frequencies. The noise mitigation circuit 36 may output each of the clock signals 48 during each consecutive time duration of a noise mitigation condition. The noise mitigation condition may span over multiple random time durations. In some embodiments, each of the multiple clock signals 48 may have a clock frequency lower than that of the clock signal of the normal condition. The noise mitigation circuit 36 may output the clock signals 48 to the neural network circuit 34 via the clock circuit 52. The clock circuit 52 may include at least one clock generating oscillator and/or PLL to generate the clock signals 48.

A set of neural network layers 46 of the neural network circuit 34 may perform transformation operations in a sequential order. The noise mitigation circuit 36 may aperiodically change clock frequencies of the neural network circuit 34 by providing each of the clock signals 48 during a different aperiodic time duration. Each aperiodic time duration may span over a fraction of a time of a transformation operation during the noise mitigation condition.

Moreover, the serially coupled neural network layers 46 may consecutively perform the transformation operations. Accordingly, each of a subset or each of the set of neural network layers 46 may receive a different clock signal 48 when performing the respective transformation operation. Moreover, noise signals associated with one or more of the subset or the set of neural network layers 46 may be dispersed over a wider frequency spectrum based on the different and aperiodically changing clock frequencies. Accordingly, the processor 38 and the noise mitigation circuit 36 may reduce magnitudes of the noise signals of the neural network circuit 34.

For example, the noise mitigation circuit 36 may output a first clock signal 48 to the neural network circuit 34 during a first transformation operation of the first neural network layer 46 based on a noise mitigation condition being present. The first transformation operation may span over multiple time durations (e.g., random time durations). The noise mitigation circuit 36 may change a clock frequency of the first neural network layer 46 by providing a different clock signal 48 for each consecutive time duration during the first transformation operation. Moreover, the noise mitigation circuit 36 may start a random timer for each of the time durations. The noise mitigation circuit 36 may select and/or retrieve (randomly select and/or retrieve) the clock frequencies from predetermined clock frequencies stored in the memory 14 and/or the nonvolatile storage 16.

The first neural network layer 46 may receive the first clock signal 48 having a first clock frequency during a first random time duration, receive a second clock signal 48 having a second clock frequency during a second random time duration consecutive to the first random time duration, and so on. The first neural network layer 46 may generate a first portion of the first result data based on first input data, the first clock signal 48, and a first supply voltage 50 during the first random time duration. The first neural network layer 46 may generate a second portion of the first result data based on first input data, the second clock signal 48, and a first supply voltage 50 during the second random time duration. That is, the first neural network layer 46 may perform a first portion of the first transformation operation based on, using, or at the first clock frequency during the first random time duration. The first neural network layer 46 may perform a second portion of the first transformation operation based on, using, or at the second clock frequency during the second random time duration, and so on. Moreover, the first neural network layer 46 may generate the first result data based on (e.g., using) the first clock signal 48 during the first random time duration, the second clock signal 48 during the second random time duration, and so on.

During subsequent time durations, the noise mitigation circuit 36 may output different clock signals 48 to the neural network circuit 34. The noise mitigation circuit 36 may select different clock frequencies for clock signals 48 of each subsequent time duration, for example, of a second neural network layer 46, a third neural network layer 46, and so on. The noise mitigation circuit 36 may start the timer with a random time for each of the time durations associated with the second and third neural network layers 46. For example, the noise mitigation circuit 36 may include a timer circuit to start and track each of the time durations for providing the first, the second, and/or additional clock signals 48. Moreover, the noise mitigation circuit 36 may retrieve the clock frequencies of the clock signals 48 from the predetermined clock frequencies stored in the memory 14 and/or the nonvolatile storage 16. As such, the neural network circuit 34 may aperiodically receive the clock signals 48 having different clock frequencies during the noise mitigation condition. Accordingly, the processor 38 and the noise mitigation circuit 36 may reduce magnitudes of the noise signals of the neural network circuit 34 by dispersing the noise signals of the first, the second, and/or the third neural network layers 46 over a wider frequency spectrum.

In alternative or additional cases, during a noise mitigation condition, the noise mitigation circuit 36 may output the multiple clock signals 48 having the different clock frequencies and multiple supply voltages 50 having different voltage values. As discussed above, the noise mitigation circuit 36 may output different clock signals 48 to the neural network circuit 34 via the clock circuit 52 during different random time durations. Moreover, a voltage manager 56 of the noise mitigation circuit 36 may generate voltage change indications 58 (e.g., control signals) to output or supply the different supply voltages 50 to the neural network circuit 34 during the different random time durations. In some embodiments, each of the different supply voltages 50 may have a voltage value lower than that of the supply voltage 50 (e.g., a single supply voltage) of the normal condition. As such, in some cases, the noise signals of the neural network layers 46 may have a reduced amplitude based on the lower voltage values of the supply voltages 50 during the noise mitigation conditions compared to the voltage value of the supply voltages 50 during the normal condition.

In the depicted embodiment, the noise mitigation circuit 36 may aperiodically output the voltage change indications 58 via the voltage manager 56 to output the multiple supply voltages 50. The memory 14 and/or the nonvolatile storage 16 may store at least some of the predetermined clock frequencies in pairs with a respective predetermined voltage value (e.g., respective voltage change indications 58). For example, the noise mitigation circuit 36 may store (e.g., set, reset) a value of the voltage change indications 58 in the registers 44. As such, values stored in the registers 44 may indicate the voltage values of the accelerator 40.

The power management unit 42 may generate the supply voltages 50 based on receiving an input voltage 60 from the power source 28 and the values stored in the registers 44. The power management unit 42 may change (e.g., adjust) voltage values of the supply voltages 50 being provided to the accelerator 40 and/or the neural network circuit 34 based on the values stored in the registers 44 being changed. The power management unit 42 may include any viable power adjustment circuitry, such as down-converters, up-converters, and/or buck-converters, to change (e.g., adjust) the voltage values of the supply voltages 50 being provided to the accelerator 40 and/or the neural network circuit 34.

Alternatively or additionally, the noise mitigation circuit 36 may output (e.g., provide) the control signals to the processor 38, the accelerator 40, the noise mitigation circuit 36, and/or the power management unit 42. In some cases, the noise mitigation circuit 36 may write the logic values of the control signals on a portion of the memory 14 and/or the nonvolatile storage 16 incorporated on the processor 38, the accelerator 40, and/or the power management unit 42. In alternative or additional cases, the processor 38, the accelerator 40, the noise mitigation circuit 36, and/or the power management unit 42 may include the registers. In such cases, the subset or set of neural network layers 46 may aperiodically receive each of the clock signals 48 with a respective supply voltage 50. Accordingly, the processor 38 and the noise mitigation circuit 36 may reduce magnitudes of the noise signals of the neural network circuit 34 and disperse the noise signals of one or more of the subset or the set of neural network layers 46 over a wider frequency spectrum.

For example, the noise mitigation circuit 36 may output the first clock signal 48 and first voltage change indication 58 during a first transformation operation of the first neural network layer 46 based on a noise mitigation condition being present. As discussed above, the noise mitigation circuit 36 may output different clock signals 48 having different clock frequencies for each consecutive time duration of the noise mitigation condition. Moreover, the noise mitigation circuit 36 may start random timers for each of the time durations.

The noise mitigation circuit 36 may also change the supply voltages 50 of the neural network circuit 34 for each of the consecutive time durations by outputting different voltage change indications 58. At least a portion of the registers 44 may receive and/or store the values of the voltage change indications 58 associated with the neural network circuit 34. The power management unit 42 may change (e.g., adjust) the voltage values based on the changing values of the registers 44 at (e.g., before) each of the consecutive time durations. In some embodiments, the noise mitigation circuit 36 may select and/or retrieve each clock frequency with a respective voltage value (e.g., respective voltage change indications 58) from predetermined values stored in the memory 14 and/or the nonvolatile storage 16.

The first neural network layer 46 may receive the first clock signal 48 having the first clock frequency and a first supply voltage 50 having a first voltage value during the first random time duration. The power management unit 42 may generate and/or output the first supply voltage 50 based on the first voltage change indication 58. The first clock frequency may be predetermined and associated with (e.g., paired with) the first voltage value. Subsequently, the first neural network layer 46 may receive the second clock signal 48 having the second clock frequency and a second supply voltage 50 having a second voltage value during the second random time duration, and so on. For example, the second clock frequency may be predetermined and associated with (e.g., paired with) the second voltage value.

The first neural network layer 46 may generate the first portion of the first result data based on the first input data, the first clock signal 48, and the first supply voltage 50 during the first random time duration. The first neural network layer 46 may generate the second portion of the first result data based on first input data, the second clock signal 48, and the second supply voltage 50 during the second random time duration. That is, the first neural network layer 46 may perform the first portion of the first transformation operation based on, using, or at the first clock frequency during the first random time duration the first supply voltage 50. The first neural network layer 46 may perform the second portion of the first transformation operation based on, using, or at the second clock frequency and the second supply voltage 50 during the second random time duration, and so on. Moreover, the first neural network layer 46 may generate the first result data based on (e.g., using) the first clock signal 48 and the first supply voltage 50 during the first random time duration, the second clock signal 48 and the second supply voltage 50 during the second random time duration, and so on.

During subsequent time durations, the noise mitigation circuit 36 may output different supply voltages 50 along with the different clock signals 48 to the neural network circuit 34. The noise mitigation circuit 36 may select different voltage values for supply voltages 50 of each subsequent time duration, for example, of a second neural network layer 46, a third neural network layer 46, and so on. As mentioned above, the noise mitigation circuit 36 may start the timer with a random time for each of the time durations associated with the second and third neural network layers 46. For example, the noise mitigation circuit 36 may include a timer circuit to start and track each of the time durations for providing the first, the second, and/or additional supply voltages 50. Moreover, the noise mitigation circuit 36 may retrieve the voltage values of the supply voltages 50 from the predetermined voltage values stored in the memory 14 and/or the nonvolatile storage 16. As such, the neural network circuit 34 may aperiodically receive the supply voltages 50 having different voltage values during the noise mitigation condition. Accordingly, the processor 38 and the noise mitigation circuit 36 may reduce magnitudes of the noise signals of the neural network circuit 34 by dispersing the noise signals of the first, the second, and/or the third neural network layers 46 over a wider frequency spectrum.

Figure 3:
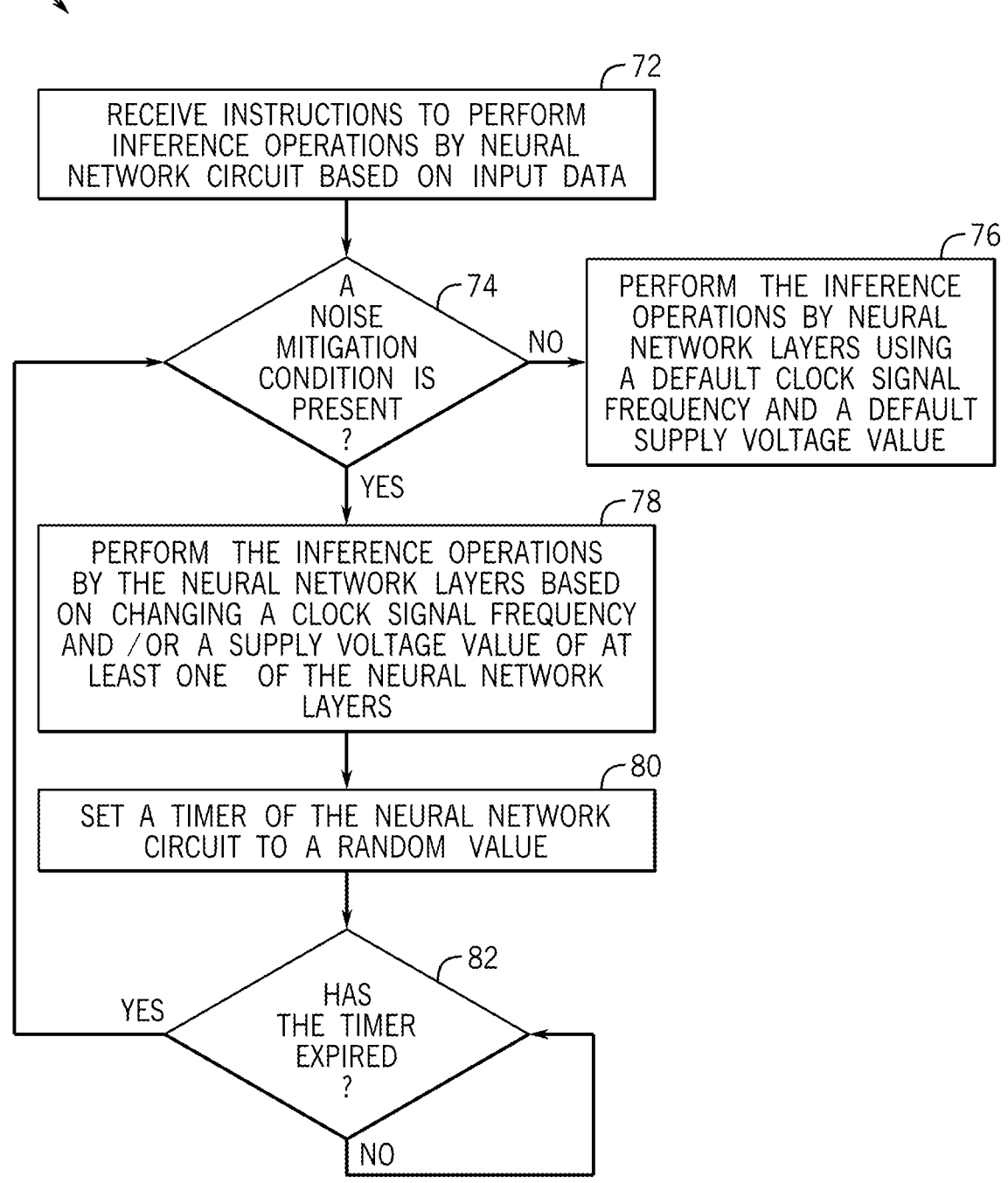
FIG. 3 is a flowchart of a method for the electronic device of FIGS. 1 and 2 to reduce at least a portion of undesired noises of the neural network circuit by the processing circuitry, according to embodiments of the present disclosure.

FIG. 3 is a flowchart of a method 70 for the electronic device 10 to reduce at least a portion of undesired noises of the neural network circuit 34 by the processing circuitry 12, according to embodiments of the present disclosure. Any suitable device (e.g., a controller) that may control components of the electronic device 10, such as the processing circuitry 12, may perform the method 70. In some embodiments, the method 70 may be implemented by executing instructions stored in a tangible, non-transitory, computer-readable medium, such as the memory 14 or nonvolatile storage 16, using the processing circuitry 12. For example, the method 70 may be performed at least in part by one or more software components, such as an operating system of the electronic device 10, one or more software applications of the electronic device 10, and the like. While the method 70 is described using steps in a specific sequence, it should be understood that the present disclosure contemplates that the described steps may be performed in different sequences than the sequence illustrated, and certain described steps may be skipped or not performed altogether.

In process block 72, the processing circuitry 12 receives instructions to perform one or multiple inference operations by the neural network circuit 34 (shown in FIG. 2) based on the input data. As discussed above, an inference operation may include transformation operations by the neural network layers 46 (shown in FIG. 2). The processing circuitry 12 may perform the inference operations and/or the transformation operations based on whether a noise mitigation condition of the processing circuitry 12 and/or the electronic device 10 is present.

In process block 74, the processing circuitry 12 determines whether a noise mitigation condition is present. The processing circuitry 12 proceeds to operation of process block 76 when the noise mitigation conditions are absent. The processing circuitry 12 proceeds to operation of process block 78 when one or more noise mitigation conditions are present. In some cases, a combination of multiple noise mitigation conditions may be present for the processing circuitry 12 to proceed to operation of process block 78.

For example, in some cases, the processing circuitry 12 may determine that a noise mitigation condition is present based on a magnitude or magnitude response of noise signals at one or more frequencies being higher than the magnitude response threshold, the raw data and/or the input data corresponding to an inference operation with a magnitude response higher than the magnitude response threshold, the raw data and/or the input data corresponding to an inference operation and/or transformation operations with a voltage draw higher than the voltage threshold, the raw data and/or the input data corresponding to an inference operation and/or transformation operations with a power consumption (e.g., a periodic power consumption) higher than the power threshold, the electronic device 10 performing a device operation associated with a noise mitigation condition, the neural network circuit 34 being disposed within the threshold distance of one or more noise sensitive components of the electronic device 10, or any combination thereof, among other possibilities.

In process block 76, the processing circuitry 12 performs the inference operations by the neural network layers 46 using a default clock frequency and a default voltage value in the normal condition. The processing circuitry 12 may generate the single clock signal 48 having the default clock frequency during the normal condition. Moreover, the processing circuitry 12 may generate the single supply voltage 50 having the default voltage value during the normal condition.

In process block 78, the processing circuitry 12 performs the inference operations by changing (e.g., adjusting, selecting) a clock frequency and/or a voltage value of at least one neural network layer 46 of the neural network layers 46. For example, the processing circuitry 12 may aperiodically generate different clock signals 48 to change operating clock frequency of the set of neural network layers 46. In some embodiments, the changing clock frequencies of the of neural network layers 46 during the noise mitigation condition may be lower than the default clock frequency of the normal condition. For example, the processing circuitry 12 may decrease the clock frequencies of the neural network layers 46 compared to the default clock frequency. In some cases, the processing circuitry 12 may change the clock frequency for portions of the accelerator 40, while leaving the frequency unchanged for other portions. In specific cases, the processing circuitry 12 may change the clock frequency for portions of one or more neural network layers 46, while leaving the frequency unchanged for other portions of the neural network layers 46.

Alternatively or additionally, the processing circuitry 12 may aperiodically generate different supply voltages 50 to change voltage values of the set of neural network layers 46. In some embodiments, the changing voltage values of the neural network layers 46 during the noise mitigation condition may be lower than the default voltage value of the normal condition. For example, the processing circuitry 12 may decrease the voltage values of the neural network layers 46 compared to the default voltage value. Moreover, the processing circuitry 12 may select a clock frequency with an associated (e.g., paired) voltage value for each aperiodic time duration associated with the neural network circuit 34.

In process block 80, the processing circuitry 12 sets a timer of the neural network circuit 34 to a random value. For example, the processing circuitry 12 may start (e.g., set, reset) the timer to random values for each time duration of each neural network layer 46 of the set of neural network layers 46. The processing circuitry 12 may change the clock frequency of the set of neural network layers 46 and/or the voltage value of the neural network layers 46 (e.g., the neural network circuit 34) for each time duration based on an expiration of the timer. In some embodiments, each time duration of a neural network layer 46 may have a fraction of a time associated with an inference operation and/or a transformation operation of the neural network layer 46 during a noise mitigation condition.

In process block 82, the processing circuitry 12 may determine whether the timer is expired. The processing circuitry 12 may return to process block 82 in response to the timer of the at least one neural network layer 46 not being expired. The processing circuitry 12 may return to process block 74 in response to the timer expiring. As such, the processing circuitry 12 determines whether a noise mitigation condition is present.

As mentioned above, the processing circuitry 12 performs the inference operations by the neural network layers 46 using the default clock frequency and the default voltage value based on a noise mitigation condition not being present. Moreover, the processing circuitry 12 performs the inference operations by adjusting the clock frequency and/or the voltage value of the at least one neural network layer 46 based on a noise mitigation condition being present. As mentioned above, each time duration of a neural network layer 46 may have a fraction of a time associated with an inference operation and/or a transformation operation of the neural network layer 46 during a noise mitigation condition. As such, the processing circuitry 12 may change the clock frequency and/or the voltage value of a neural network layer 46 multiple times during an inference operation and/or a transformation operation of the neural network circuit 34 during the noise mitigation condition. In this manner, the method 70 enables the processing circuitry 12 and/or the electronic device 10 to reduce noise and/or perform device operations with reduced interference.

Figure 4:
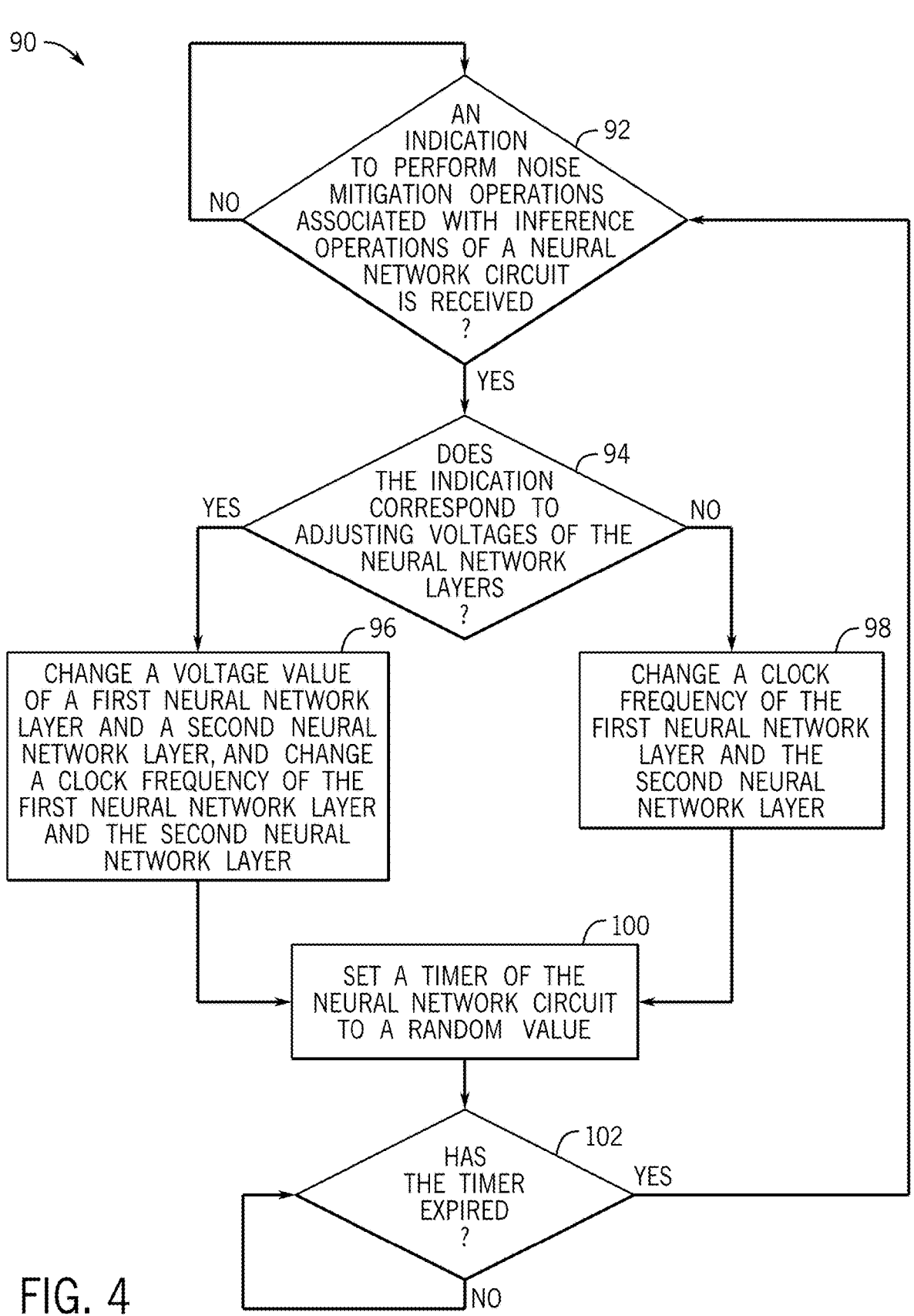
FIG. 4 is a flowchart of a method for the electronic device of FIGS. 1 and 2 to reduce at least a portion of undesired noises of the neural network circuit by the noise mitigation circuit, according to embodiments of the present disclosure.

FIG. 4 is a flowchart of a method 90 for the electronic device 10 to reduce at least a portion of undesired noises of the neural network circuit 34 by the noise mitigation circuit 36 (shown in FIG. 2), according to embodiments of the present disclosure. Any suitable device (e.g., a controller) that may control components of the electronic device 10, such as the noise mitigation circuit 36, may perform the method 90. In some embodiments, the method 90 may be implemented by executing instructions stored in a tangible, non-transitory, computer-readable medium, such as the memory 14 or nonvolatile storage 16, using the noise mitigation circuit 36. For example, the method 90 may be performed at least in part by one or more software components, such as an operating system of the electronic device 10, one or more software applications of the electronic device 10, and the like. While the method 90 is described using steps in a specific sequence, it should be understood that the present disclosure contemplates that the described steps may be performed in different sequences than the sequence illustrated, and certain described steps may be skipped or not performed altogether.

In process block 92, the noise mitigation circuit 36 determines whether an indication to perform noise mitigation operations associated with inference operations of the neural network circuit 34 is received. The noise mitigation circuit 36 may receive a noise mitigation indication (e.g., the noise mitigation indication 54) based on one or more of example noise mitigation conditions mentioned below and/or other noise mitigation conditions being present.

For example, a first noise mitigation condition may be present based on a magnitude or magnitude response of noise signals at one or more frequencies being higher than the magnitude response threshold. A second noise mitigation condition may be present based on the raw data and/or the input data corresponding to an inference operation with a magnitude response higher than the magnitude response threshold. A third noise mitigation condition may be present based on the raw data and/or the input data corresponding to an inference operation and/or transformation operations with a voltage draw higher than the voltage threshold. A fourth noise mitigation condition may be present based on the raw data and/or the input data corresponding to an inference operation and/or transformation operations with a power consumption (e.g., a periodic power consumption) higher than the power threshold. A fifth noise mitigation condition may be present based on the electronic device 10 performing a device operation associated with a noise mitigation condition. A sixth noise mitigation condition may be present based on the neural network circuit 34 being disposed within the threshold distance of one or more noise sensitive components of the electronic device 10.

The noise mitigation circuit 36 may return to the process block 92 when the indication is not received. The processing circuitry 12 and/or the neural network circuit 34 may perform the inference operations based on normal conditions when the indication is not received or when the indication is removed. The noise mitigation circuit 36 proceeds to the process block 94 when the indication is received.

In process block 94, the noise mitigation circuit 36 determines whether the indication corresponds to adjusting voltages of the neural network layers 46. The noise mitigation circuit 36 proceeds to the process block 96 when the indication corresponds to adjusting voltages of the neural network layers 46. The noise mitigation circuit 36 proceeds to the process block 98 when the indication does not correspond to adjusting voltages of the neural network layers 46.

For example, the indication may correspond to adjusting voltages and/or clock frequencies of the neural network layers 46. In some cases, the noise mitigation circuit 36 may determine that the indication corresponds to adjusting voltages of the neural network layers 46 based on the indication being indicative of first one or more combinations of the noise mitigation conditions being present. Moreover, the noise mitigation circuit 36 may determine that the indication does not correspond to adjusting voltages of the neural network layers 46 based on the indication being indicative of second one or more combinations of the noise mitigation conditions being present.

In alternative or additional cases, the noise mitigation circuit 36 may determine that the indication corresponds to adjusting voltages of the neural network layers 46 based on the neural network circuit 34 being coupled to a dedicated voltage rail. In some embodiments, the power management unit 42 and/or the power source 28 discussed above may provide a shared voltage rail to the accelerator 40 and one or more other components of the electronic device 10 (e.g., the processor 38). In alternative or additional embodiments, the power management unit 42 and/or the power source 28 may provide a dedicated voltage rail to the accelerator 40. In such embodiments, the power management unit 42 and/or the power source 28 may supply different voltage values to the accelerator 40 compared to other components. Accordingly, the noise mitigation circuit 36 may determine that the indication corresponds to adjusting voltages of the neural network layers 46 based on the neural network circuit 34 being coupled to a dedicated voltage rail.

In process block 96, the noise mitigation circuit 36 changes a voltage value of the first neural network layer 46 and the second neural network layer 46, and changes a clock frequency of the first neural network layer 46 and the second neural network layer 46. For example, the first neural network layer 46 and the second neural network layer 46 may perform respective transformation operations sequentially. The noise mitigation circuit 36 changes clock signals 48 and supply voltages 50 of the first neural network layer 46 based on expiration of time durations when performing the first transformation operation of the first neural network layer 46. Moreover, the noise mitigation circuit 36 changes clock signals 48 and supply voltages 50 of the second neural network layer 46 based on expiration of time durations when performing the second transformation operation of the second neural network layer 46. The noise mitigation circuit 36 proceeds to the process block 100 to set a random timer for the neural network circuit 34.

It should be appreciated that the first and the second neural network layers 46 are mentioned by way of example and additional neural network layers 46 may perform respective transformation operations subsequent to or in parallel, during at least partially overlapping times, with the first and/or second neural network layers 46. Moreover, the noise mitigation circuit 36 may change a voltage value of the first neural network layer 46, the second neural network layer 46, and the additional neural network layers 46 (e.g., the set of neural network layers 46), and may change clock frequencies of the first neural network layer 46, the second neural network layer 46, and the additional neural network layers 46.

In process block 98, the noise mitigation circuit 36 changes a clock frequency of the first neural network layer 46 and the second neural network layer 46. As mentioned above, the first neural network layer 46 and the second neural network layer 46 may perform respective transformation operations sequentially. The noise mitigation circuit 36 changes clock signals 48 of the first neural network layer 46 based on expiration of time durations when performing the first transformation operation of the first neural network layer 46. Moreover, the noise mitigation circuit 36 changes clock signals 48 of the second neural network layer 46 based on expiration of time durations when performing the second transformation operation of the second neural network layer 46. The noise mitigation circuit 36 proceeds to the process block 100 to set a random timer for the neural network circuit 34.

It should be appreciated that the first and the second neural network layers 46 are mentioned by way of example and additional neural network layers 46 may perform respective transformation operations sequentially or in parallel with the first and/or second neural network layers 46. Moreover, the noise mitigation circuit 36 may change a clock frequency of the first neural network layer 46, the second neural network layer 46, and the additional neural network layers 46 (e.g., the set of neural network layers 46).

In process block 100, the noise mitigation circuit 36 sets a timer of the neural network circuit 34 to a random value. For example, the noise mitigation circuit 36 may start (e.g., set, reset) the timer with a random value for each time duration of the neural network circuit 34. It should be appreciated that the noise mitigation circuit 36 may start the random timer for the first neural network layer 46, the second neural network layer 46, and the additional neural network layers 46 (e.g., the set of neural network layers 46) with the random values.

In process block 102, the noise mitigation circuit 36 may determine whether the timer of the neural network circuit 34 is expired. The noise mitigation circuit 36 may return to process block 102 in response to the timer of the neural network circuit 34 not being expired. The noise mitigation circuit 36 may return to process block 92 in response to the timer expiring. In this manner, the method 90 enables the noise mitigation circuit 36 and/or the electronic device 10 to reduce noise and/or perform device operations with reduced interference.

As used herein, machine-learning may refer to algorithms and statistical models that computer systems (e.g., including the electronic device 10) use to perform a specific task with or without using explicit instructions. For example, a machine-learning process may generate a mathematical model based on a sample of data, known as "training data," in order to make predictions or decisions without being explicitly programmed to perform the task.

Depending on the inferences to be made, the neural network circuit 34 may implement different forms of machine-learning. For example, in some embodiments (e.g., when particular known examples exist that correlate to future predictions or estimates that the machine-learning engine may be tasked with generating), a machine-learning engine may implement supervised machine-learning. In supervised machine-learning, a mathematical model of a set of data contains both inputs and desired outputs. This data is referred to as "training data" and may include a set of training examples. Each training example may have one or more inputs and a desired output, also known as a supervisory signal. In a mathematical model, each training example is represented by an array or vector, sometimes called a feature vector, and the training data is represented by a matrix. Through iterative optimization of an objective function, supervised learning algorithms may learn a function that may be used to predict an output associated with new inputs. An optimal function may allow the algorithm to correctly determine the output for inputs that were not a part of the training data. An algorithm that improves the accuracy of its outputs or predictions over time is said to have learned to perform that task.

Supervised learning algorithms may include classification and regression techniques. Classification algorithms may be used when the outputs are restricted to a limited set of values, and regression algorithms may be used when the outputs have a numerical value within a range. Similarity learning is an area of supervised machine-learning closely related to regression and classification, but the goal is to learn from examples using a similarity function that measures how similar or related two objects are. Similarity learning has applications in ranking, recommendation systems, visual identity tracking, face verification, and speaker verification.

Additionally and/or alternatively, in some situations, it may be beneficial for the machine-learning engine to utilize unsupervised learning (e.g., when particular output types are not known). Unsupervised learning algorithms take a set of data that contains only inputs, and find structure in the data, like grouping or clustering of data points. The algorithms, therefore, learn from test data that has not been labeled, classified, or categorized. Instead of responding to feedback, unsupervised learning algorithms identify commonalities in the data and react based on the presence or absence of such commonalities in each new piece of data.

That is, the machine-learning engine may implement cluster analysis, which is the assignment of a set of observations into subsets (called clusters) so that observations within the same cluster are similar according to one or more predesignated criteria, while observations drawn from different clusters are dissimilar. Different clustering techniques make different assumptions on the structure of the data, often defined by some similarity metric and evaluated, for example, by internal compactness, or the similarity between members of the same cluster, and separation, the difference between clusters. In additional or alternative embodiments, the machine-learning engine may implement other machine-learning techniques, such as those based on estimated density and graph connectivity.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. Processing circuitry comprising:
a neural network circuit configured to implement a transformer comprising a first layer and a second layer, wherein the first layer is configured to operate based on a first clock signal, and the second layer is configured to operate based on a second clock signal; and
a noise mitigation circuit coupled to the neural network circuit, wherein the noise mitigation circuit is configured to output the first clock signal having a first frequency during a first time duration, and output the second clock signal having a second frequency during a subsequent time duration based on a noise mitigation condition.

2. The processing circuitry of claim 1, wherein the noise mitigation circuit is configured to determine a first random time of the first time duration and a second random time of the subsequent time duration based on the noise mitigation condition.

3. The processing circuitry of claim 1, wherein the noise mitigation circuit is configured to aperiodically output different clock signals having different frequencies to the neural network circuit based on the noise mitigation condition.

4. The processing circuitry of claim 1, wherein the noise mitigation circuit is configured to decrease the first frequency and the second frequency based on the noise mitigation condition.

5. The processing circuitry of claim 1, wherein the noise mitigation circuit is configured to aperiodically change supply voltages of the neural network circuit based on the noise mitigation condition.

6. The processing circuitry of claim 1, wherein the noise mitigation circuit is configured to provide a first supply voltage to the first layer during the first time duration and provide a second supply voltage to the second layer during the subsequent time duration based on the noise mitigation condition.

7. The processing circuitry of claim 6, wherein the noise mitigation circuit is configured to retrieve the first frequency, the second frequency, the first supply voltage, or the second supply voltage from memory.

8. An electronic device comprising:
a neural network circuit configured to implement a plurality of layers; and
a noise mitigation circuit coupled to the neural network circuit, wherein the noise mitigation circuit is configured to aperiodically output different clock signals to the neural network circuit based on a noise mitigation condition of the electronic device.

9. The electronic device of claim 8, wherein the noise mitigation circuit is configured to aperiodically change a supply voltage of the neural network circuit based on the noise mitigation condition.

10. The electronic device of claim 8, comprising a power management unit coupled to the neural network circuit and the noise mitigation circuit, wherein the noise mitigation circuit is configured to cause the power management unit to aperiodically output a different supply voltage to the neural network circuit.

11. The electronic device of claim 8, wherein a first layer of the plurality of layers is configured to operate based on a first clock signal, and a second layer of the plurality of layers is configured to operate based on a second clock signal having a different clock frequency compared to the first clock signal.

12. The electronic device of claim 11, wherein the noise mitigation circuit is configured to output the first clock signal during a first aperiodic duration and output the second clock signal during a subsequent aperiodic duration.

13. The electronic device of claim 8, wherein the noise mitigation condition is based on an electrical current consumption of the electronic device being higher than a threshold.

14. Tangible, non-transitory, computer-readable media storing instructions that, when executed by processing circuitry, cause the processing circuitry to:
receive a first indication to perform transformation operations by a plurality of neural network layers;
change a first clock signal frequency of a first neural network layer of the plurality of neural network layers to a first frequency during a first transformation operation of the first neural network layer; and
change a second clock signal frequency of a second neural network layer of the plurality of neural network layers to a second frequency during a second transformation operation of the second neural network layer based on a noise mitigation condition.

15. The tangible, non-transitory, computer-readable media of claim 14, wherein the instructions cause the processing circuitry to change a first supply voltage of the plurality of neural network layers to a first voltage value during the first transformation operation, and a second supply voltage of the plurality of neural network layers to a second voltage value during the second transformation operation based on the noise mitigation condition.

16. The tangible, non-transitory, computer-readable media of claim 14, wherein the instructions cause the processing circuitry to change the first clock signal frequency of the first neural network layer and the second clock signal frequency of the second neural network layer to a lower frequency compared to a default clock signal frequency.

17. The tangible, non-transitory, computer-readable media of claim 16, wherein the instructions cause the processing circuitry to perform the transformation operations by using the default clock signal frequency based on a lack of the noise mitigation condition.

18. The tangible, non-transitory, computer-readable media of claim 14, wherein the tangible, non-transitory, computer-readable media is configured to store a plurality of frequency values comprising the first frequency and the second frequency, wherein the instructions cause the processing circuitry to retrieve the first frequency and the second frequency from the tangible, non-transitory, computer-readable media.

19. The tangible, non-transitory, computer-readable media of claim 14, wherein the instructions cause the processing circuitry to determine the noise mitigation condition based on the plurality of neural network layers drawing electrical current higher than a threshold.

20. The tangible, non-transitory, computer-readable media of claim 14, wherein the instructions cause the processing circuitry to change the first clock signal frequency based on expiration of a first timer, and change the second clock signal frequency based on expiration of a second timer.

\* \* \* \* \*